United States Patent
Kitamura et al.

(10) Patent No.: US 6,670,079 B1
(45) Date of Patent: Dec. 30, 2003

(54) PHOTOREFRACTIVE MATERIAL

(75) Inventors: Kenji Kitamura, Tsukuba (JP); Yasunori Furukawa, Tsukuba (JP); Shunji Takekawa, Tsukuba (JP); Myeongkyu Lee, Tsukuba (JP); Hideki Hatano, Tsurugashima (JP); Satoru Tanaka, Tsurugashima (JP); Takashi Yamaji, Tsurugashima (JP)

(73) Assignees: Director General of National Institute for Research in Inorganic Materials, Ibaraki (JP); Pioneer Corporation, Tokyo (JP)

( * ) Notice: Subject to any disclaimer, the term of this patent is extended or adjusted under 35 U.S.C. 154(b) by 0 days.

(21) Appl. No.: 09/598,222

(22) Filed: Jun. 21, 2000

(30) Foreign Application Priority Data

Jun. 24, 1999 (JP) .......................... 11-178665

(51) Int. Cl.$^7$ ................................ G03H 1/03
(52) U.S. Cl. ................. 430/1; 430/2; 359/3; 359/7
(58) Field of Search ................ 359/3, 7; 430/1, 430/2

(56) References Cited

U.S. PATENT DOCUMENTS

| | | | | |
|---|---|---|---|---|
| 5,699,175 A | * | 12/1997 | Wilde | 359/7 |
| 5,904,912 A | | 5/1999 | Kitamura et al. | 423/594 |
| 6,373,806 B1 | * | 4/2002 | Kitamura et al. | 369/103 |
| 6,535,472 B1 | * | 3/2003 | Lee et al. | 369/103 |

OTHER PUBLICATIONS

Li et al. "effect of doping on the increase . . . ", Guisuanyan Xuebao vol. 22(6) pp. 592–595 (1994).*
Li et al, "Reduction of the photorefractive response time . . . " Proc. SPIE vol. 2379 pp. 248–300 (1995).*
Wang et al., "Growth and the photorefractive effect . . . " Guangzi Xuebao vol. 25(5) pp. 403–406 (1996).*
Abstract of Wang et al., "Growth and the photorefractive effect . . . ", Guangzi Xuebao Vo. 25(5) pp. 403–406 (1996).
Abstract of Li et al., "reduction of the photorefractive response time . . . ", Proc. SPIE vol. 2379 pp. 248–300 (1995).
Abstract of Li et al., "Effect of doping on increase of the . . . " Guisuanyan Xuebao vol. 22(6) pp. 592–595 (1994).
Jermann et al., "Photorefractive properties of congruent . . . " JOSA B vol. 12(11) pp. 2066–2070 (Nov. 1995).
Guenther, et al., "Two color holography . . . " Appl. Opt., vol. 37(32) pp. 7611–7623 (Nov. 1998).*
Furukawa et al., "Stiochiometric LiTaO3 for dynamic . . . " Jap. J. Appl. Phys. vol. 38(3B) pp. 1816–1819 (Mar. 1999).*
Bai et al., "Non–Volatile Holographic storage . . . ", Phys. Rev. Lett., vol. 78(14) pp. 2944–2947 (Apr. 1997).*
Furukawa et al., "Photorefractive properties of iron doped . . . " Opt. Lett. vol. 22(8) pp. 501–503 (Apr. 1997).*
Darwish et al., "Investigations of the charge transfer . . . " Proc. SPIE vol. 3137 pp. 63–74. (Jul. 1997).*
Chan et al., "Study on the photorefractive effect . . . ", Proc. SPIE vol. 2321 pp. 722–723 (Aug. 1994).*
McMillen et al., "Analysis of twelve specially doped . . . ", Proc. SPIE vol. 3137 pp. 39–49 (Apr. 1997).*
Cook et al., "High Optical gain using . . . " Appl. Phys B., vol. 68 pp. 911–916 (Mar. 1999).*

* cited by examiner

*Primary Examiner*—Martin Angebranndt
(74) *Attorney, Agent, or Firm*—Morgan, Lewis & Bockius LLP

(57) ABSTRACT

A photorefractive material provides a high photosensitivity without reduction. The material comprises a single crystal of terbium (Tb)-doped niobate or tantalate. The single crystal is a single crystal of lithium niobate ($LiNbO_3$) whose molar fraction of $[Li_2O]/([Li_2O]+[Nb_2O_5])$ lies in a range of 0.482 to 0.505, or a single crystal of lithium tantalate ($LiTaO_3$) whose molar fraction of $[Li_2O]/([Li_2O]+[Ta_2O_5])$ lies in a range of 0.482 to 0.505. The amount of terbium added in the photorefractive material ranges from 10 weight ppm to 1000 weight ppm.

8 Claims, 9 Drawing Sheets

PHOTOREFRACTIVE MATERIAL

BACKGROUND OF THE INVENTION

1. Field of the Invention

The present invention relates to a photorefractive material and composition which have a photorefractive effect, and, more particularly, to a holographic recording medium which is used in a volume holographic memory or the like.

2. Description of the Related Art

Conventionally, a holographic memory system is known as a digital recording system using the principle of holography. The holographic memory system records digital data on a memory medium made of a photorefractive crystal such as lithium niobate ($LiNbO_3$) or the like, and reproduces the data from the same. The photorefractive effect is a phenomenon in such that electric charges generated by photo-excitation move within a crystal thereby to form a spatial electric field distribution, which combines with a primary electro-optical effect i.e., Pockels effect to change a refractive index distribution in the crystal. In a ferroelectric crystal or the like exhibiting the photo-refractive effect, its change of the refractive index is responsive even to a fine optical input pattern of 1,000 lines or more per one millimeter. This effective action is generated at a response speed on the order of microseconds to seconds in real time, though the response speed varies depending on kinds of materials. Therefore, a variety of applications for such crystals has been studied as a real time hologram medium which does not require any developing the medium.

The holographic memory system is capable of recording and reproducing data on a two-dimensional plane page unit, and also performing a multiple recording with use of a plurality of the page units. The volume holographic memory is designed to enable three-dimensional recording with a crystal medium being of a three-dimensional shape such as a rectangular parallelepiped or the like.

As shown in FIG. 1, there are two recording modes: a single color (1-color) hologram system and a two-color hologram system. The single color hologram system performs recording and reproduction using interference of information-carrying coherent light with one wavelength $\lambda1$ and uses $LiNbO_3$ crystal as a medium to which, for example, iron (Fe) is added or doped. In the portion of the crystal which has bright interference fringes, light is absorbed and then electrons excited to the conduction band CB from the level "A" of $Fe^{2+}$ (the center of light absorption), are diffused into a dark portion and eventually trapped at the level "C" of $Fe^{3+}$ (the deep trap level or storage center) as shown in FIG. 1. The electrooptic effect that is induced by the spatial distribution of the densities of electrons produced that way produces a spatial refractive index distribution corresponding to the interference fringes in the crystal so that information can be stored.

The single color hologram system has a problem that a medium has a sensitivity to light of one wavelength that is used at the time of recording and reproduction. In a single color hologram, recorded information is electrons trapped at the trap level (storage center "C") which is produced by Fe, so that what is called reproduction deterioration occurs. That is, every time reproduction is performed, electrons are gradually excited to the conduction band CB from the trap level, thereby erasing the stored information. According to the conventional holographic memory, at the time signals are read from a hologram recorded there, reproduction light gradually erases the hologram.

The two-color hologram system can suppress the reproduction deterioration. As shown in FIG. 1, the characteristic of the two-color hologram system lies in that at the time of recording, reference light and signal light (wavelength $\lambda1$) of recording light that forms a hologram, and another light called "gate light" (wavelength $\lambda2$) are irradiated simultaneously to record the hologram. The gate light provides the crystal with the recording sensitivity at the wavelength ($\lambda1$) of the recording light only during the irradiation of the gate light. This property temporarily forms carriers at a relatively shallow energy level called "intermediate excitation level B" in the crystal only in the irradiated portion and only for the irradiation time. The carriers of the intermediate excitation level "B" is excited to the conduction band CB by the recording light (a spatial contrast pattern corresponding to the interference fringes produced by the reference light and signal light) and are finally stored at the deep trap level "C" in the form of the carrier density distribution corresponding to the interference fringes. This completes recording.

Recording of a two-color hologram with $LiNbO_3$ was announced by von der Linde, et al. in 1974 (D. von der Linde, A. M. Glass and K. F. Rodgers: "Multiphoton photorefractive processes for optical storage in $LiNbO_3$", Appl. Phys. Lett., Vol.25, pp. 155–157 (1974). Because the materials available then had a short carrier life (of a nano-second order) at the intermediate excitation level, recording was possible only with a pulse laser which has large peak power. Crystals available today that are acquired by performing reduction on $LiNbO_3$ doped with Pr (praseodymium) (H. Guenther, G. Wittmann, and R. M. Macfarlene (IBM), R. R. Neurgaonkar (Rockwell): "Intensity dependence and white-light gating of two-color photorefractive gratings in $LiNbO_3$", Opt. Lett. Vol. 22, pp. 1305–1307 (1997), or $LiNbO_3$ which contains no additive or is doped with Fe and whose composition ratio is close to a stoichiometric composition ratio (the latter abbreviated to SLN) (H. Guenther, R. M. Macfarlane, Y. Furukawa, K. Kitamura; "Two-color holography in reduced near- stoichiometric lithium niobate", Appl. Opt. Vol. 37,pp. 7611–7623 (1998) can increase the carrier life to micro seconds to several seconds in the intermediate excitation level (metastable level) and can permit recording by using a laser of continuous wave oscillation that has relative small power.

The following discusses the mechanism of exciting carriers that dedicate to a two-color hologram in a $LiNbO_3$ single crystal undergone reduction (bipolaron/polaron mechanism). When a $LiNbO_3$ single crystal is subjected to a heat treatment under a proper reduction atmosphere, a bipolaron is formed. The bipolaron is the state where a single electron is trapped by each of adjoining $Nb_{Li}$ (Nb of the Li site) and $Nb_{Nb}$ (Nb of the Nb site) and those electrons form a pair. The bipolaron forms a wide absorption band whose center lies around 2.5 eV. When electrons are excited from the bipolaron absorption band by the irradiation of the gate light that has a wavelength of 400 nm to 500 nm, the bipolaron is photodissociated and a small polaron state appears. The small polaron is the state where an electron is trapped by $Nb_{Li}$ (Nb of the Li site) and this state corresponds to an electron being present at the intermediate excitation level.

Two-color holographic recording media which use this bipolaron mechanism have the following shortcomings.

(1) Reduction is required. That is, this type of recording medium can hardly be used as a recording material because of a low sensitivity in the as-grown state or after a heat treatment performed in the air.

(2) Excessive reduction increases the dark conductivity of a crystal, thus shortening the storage time, which raises practical problems.

(3) As the degree of reduction performed significantly changes the characteristic, it is difficult to control the characteristic.

(4) With regard to materials doped with Fe or the like, reduction causes most of $Fe^{3+}$ to be reduced to $Fe^{2+}$. This decreases the density of $Fe^{3+}$ necessary as a trap and $Fe^{2+}$ enhances absorption, thus raising practical problems. There is a demand for the development of practical materials that do not require reduction.

OBJECT AND SUMMARY OF THE INVENTION

Thus, it is an object of the present invention to provide a photorefractive material which provides high photosensitivity without reduction.

A photorefractive material according to the present invention characteristically comprises a single crystal of niobate or tantalate doped with terbium (Tb).

In the photorefractive material, the single crystal may be a single crystal of lithium niobate ($LiNbO_3$) whose molar fraction of $[Li_2O]/([Li_2O]+[Nb_2O_5])$ lies in a range of 0.482 to 0.505 preferably 0.490 to 0.505.

In the photorefractive material, the single crystal may be a single crystal of lithium tantalate ($LiTaO_3$) whose molar fraction of $[Li_2O]/([Li_2O]+[Ta_2O_5])$ lies in a range of 0.482 to 0.505 preferably 0.490 to 0.505.

In the above photorefractive material, the amount of terbium added may range from 10 weight ppm to 1000 weight ppm.

In an aspect of the present invention, said single crystal contains Fe, Mn, Cr or Ni in addition to terbium.

In another aspect of the present invention, an amount of Fe, Mn, Cr or Ni added ranges from 1 weight ppm to 500 weight ppm.

In a further aspect of the present invention, a two-color holographic recording medium comprising a photorefractive material above mentioned is formed into a predetermined shape such as cube, cylinder, sphere, disk, rectangular parallelepiped, polyhedron or the like.

DETAILED DESCRIPTION OF THE PREFERRED EMBODIMENTS

Preferred embodiments of the present invention will now be described referring to the accompanying drawings.

EXAMPLE 1

$LiNbO_3$ Single Crystal Having a Constant-ratio Composition Doped With 100 Weight ppm of Tb Using a single crystal pulling equipment of a continuous source feeding type based on the double crucible method, a plurality of single crystals with the stoichiometric composition ratio (SLN) were grown which had an excellent optical homogeneous property. The single crystals with a molar fraction of $[Li_2O]/([Ta_2O_5]+[Li_2O])$ ranging from 0.482 to 0.505 were grown from a melted solution acquired by doping 100 weight ppm of Tb in the composition of a melted solution $[Li_2O]/([Ta_2O_5]+[Li_2O])$ ranging from 0.56 to 0.60. It is preferable that the doping amount of Tb be selected from the range of 10 weight ppm to 1000 weight ppm.

When the respective as-grown crystals were irradiated with light of a wavelength of 313 nm and measured in the light absorption spectrum, such single crystals with a molar fraction of $[Li_2O]/([Ta_2O_5]+[Li_2O])$ ranging from 0.482 to 0.505 showed photochromism. Particularly the resultant as-grown crystals with a molar fraction of $[Li_2O])/([Ta_2O_5]+[Li_2O])$ ranging from 0.490 to 0.505 or from 0.495 to 0.500 showed significant photochromism changing from the absorption coefficient characteristic "D" before the light irradiation to the characteristic "E" after the light irradiation as apparent from FIG. 2. The depth of the energy level was calculated to be about 1.9 eV from the conduction band. It was evident from the above that there were an absorption center "A" and a deep trap level "C" of the crystal shown in FIG. 1.

Figure 3:
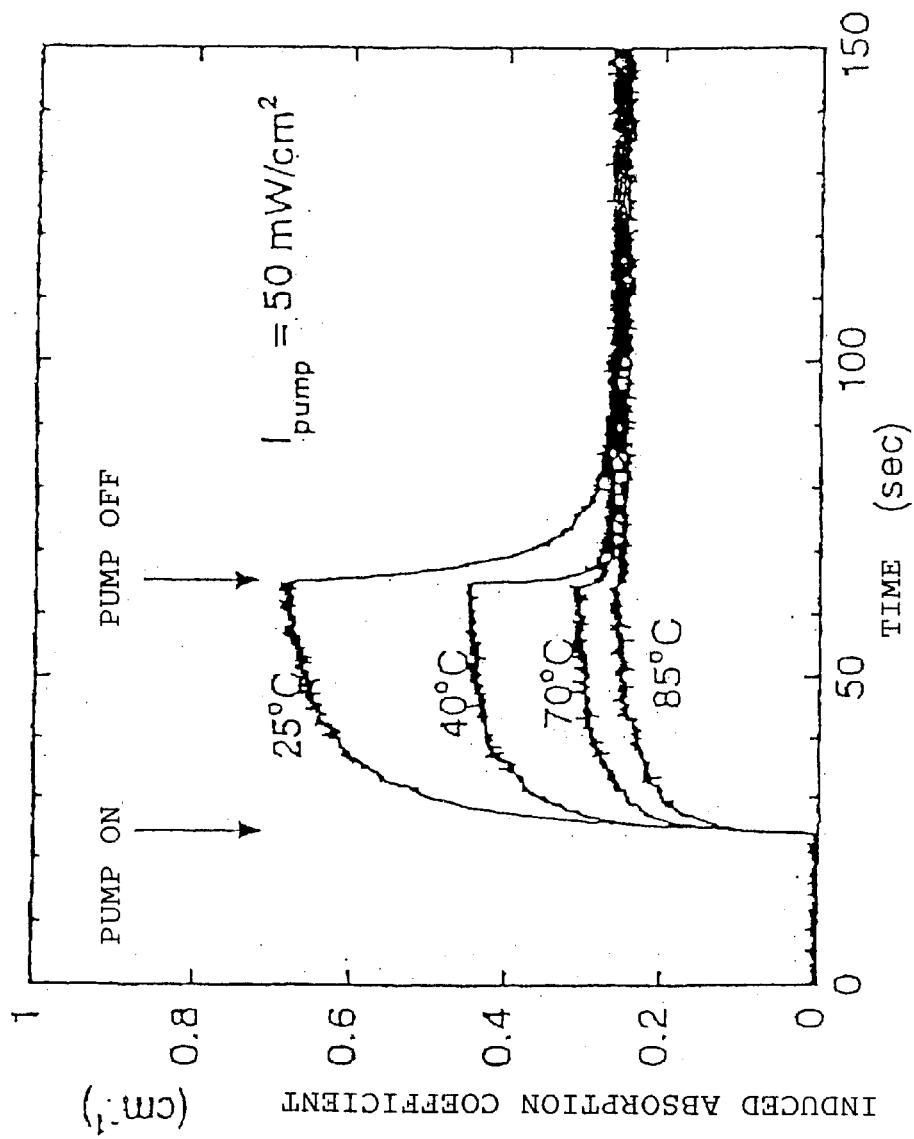
FIGS. 3 through 5 are graphs each illustrating a relationship between an induced absorption coefficient and elapse of time in which the change of absorption induced by ultraviolet-rays (313 nm) is dependent on time in spectrum of photorefractive materials according to the present invention which comprises a $LiTaO_3$ single crystal doped with terbium (Tb)
Figure 4:
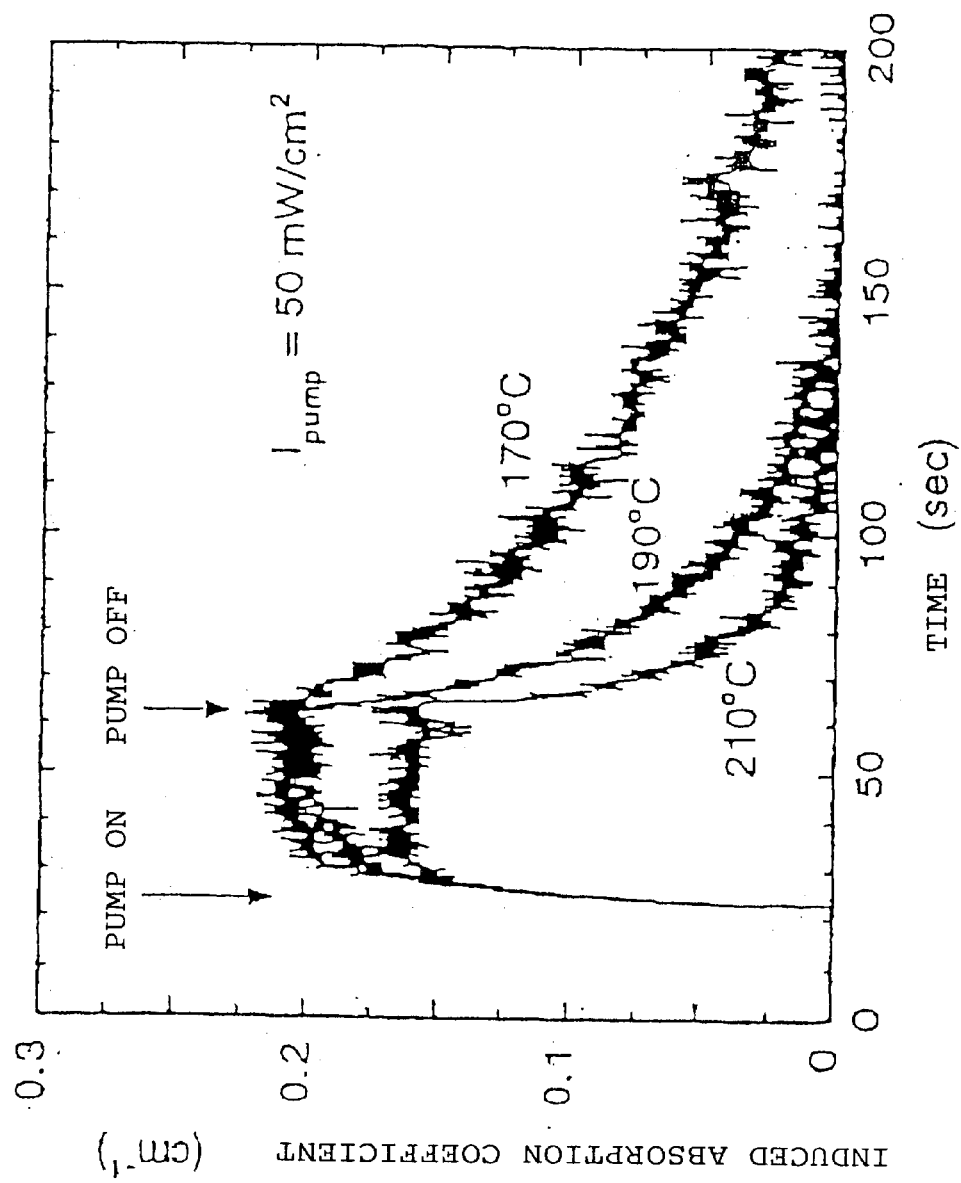

The change absorption coefficient induced by ultraviolet-rays (wavelength of 313 nm) with time was measured at 25° C., 40° C., 70° C., 85° C., 170° C., 190° C. and 210° C. using monitor light of a wavelength of 532 nm, in which the temperature dependency of the change of absorption coefficient occurred. FIGS. 3 and 4 show the results of the measurement. As apparent from those data, it is understood that a temperature change of photochromism in a Tb-doped $LiNbO_3$ single crystal indicates the presence of an intermediate metastable level at a shallow level from the conduction band (CB). Consequently the presence of the shallow trap level "B" and the deep trap level "C" shown in FIG. 1 became apparent from the relationship between light-induced absorption and temperature.

Figure 5:
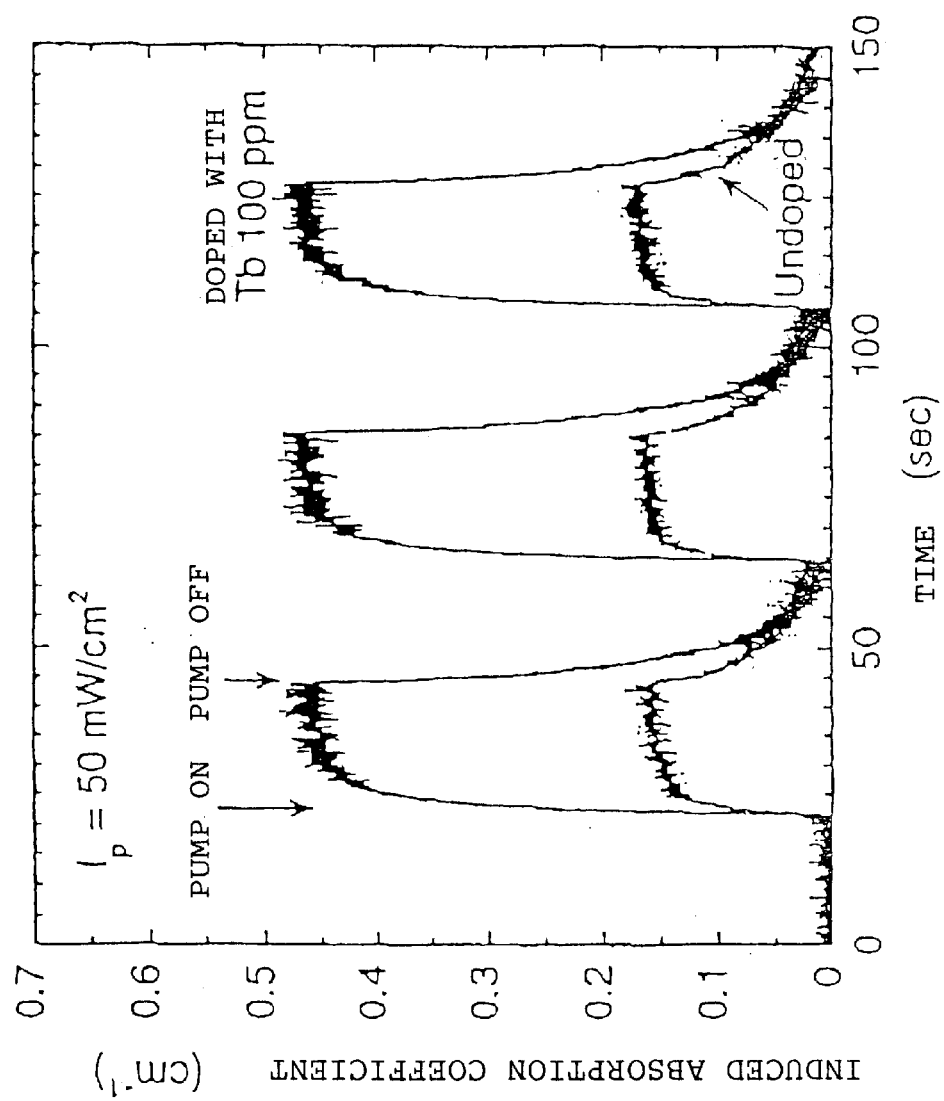

For a comparison between the Tb-doped (100 ppm) $LiNbO_3$ single crystal and an impurity-undoped crystal, absorption efficiencies at a wavelength of 852 nm induced by ultraviolet-rays (wavelength of 313 nm) were measured as time passed. FIG. 5 shows the results of the measurement. It is apparent that ultraviolet-rays induced absorption occurs at the wavelength of hologram-recording light and the absorption coefficient of the Tb-doped $LiNbO_3$ single crystal is higher than that of the impurity-undoped crystal.

Figure 7:
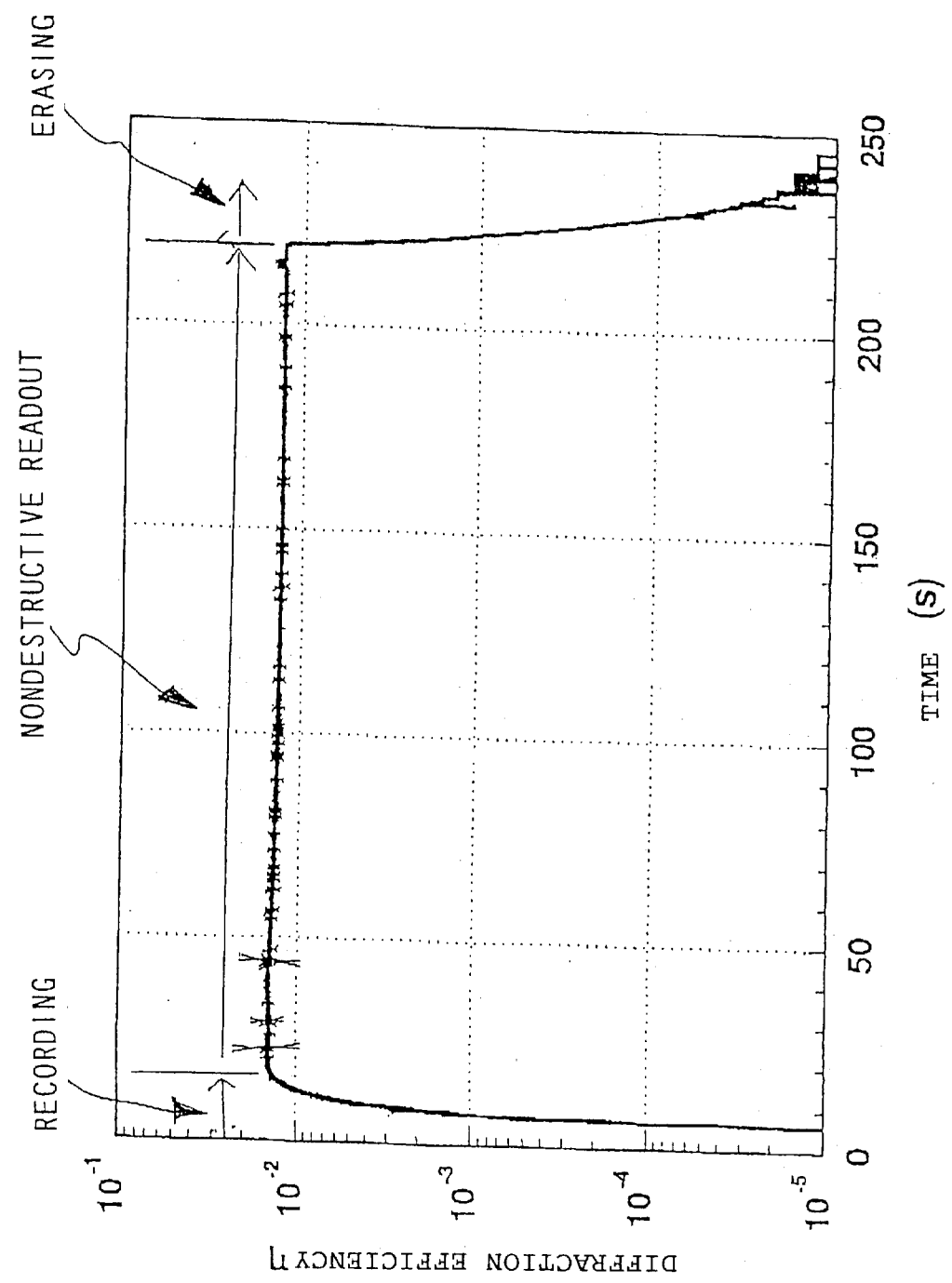
FIG. 7 is a graph showing a relationship between a diffraction efficiency and elapse of time in which the change of diffraction efficiency when a hologram is written in a Tb-doped $LiNbO_3$ single crystal according to the present invention.

Next, a writing test was performed that holograms were written in the acquired Tb-doped $LiNbO_3$ single crystal using those levels and using coherent light of a longer wavelength of 850 nm (54 $mW/cm^2$+52 $mW/cm^2$) while irradiation light from a Φ1-cm Hg—Xe lamp with a wavelength 313 nm as gate light, and a time-dependent change in diffraction efficiency was measured by an optical system of a holographic memory system according to the present invention. The results are shown in FIG. 7.

Figure 6:
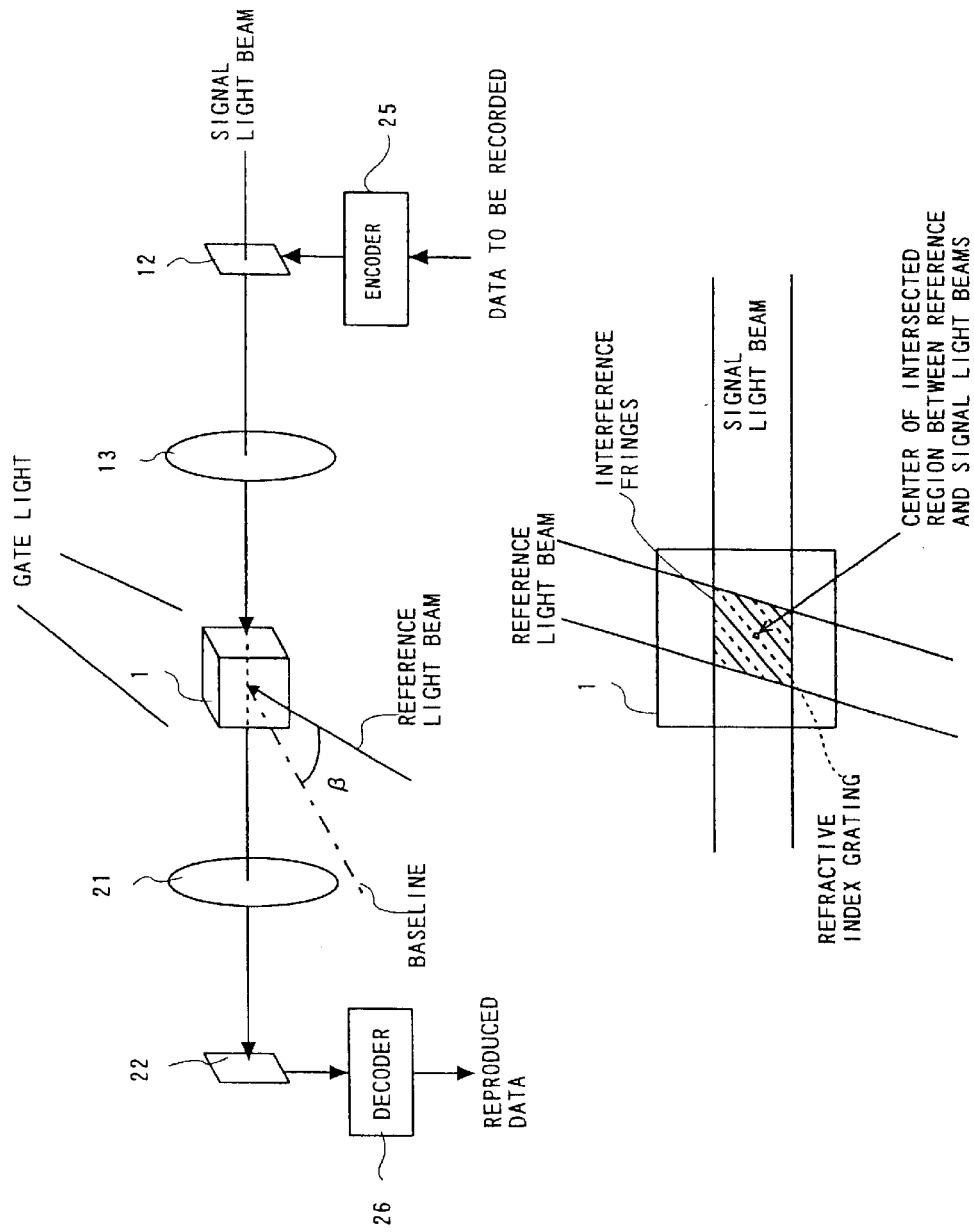
FIG. 6 is a diagram depicting a structure of a measuring optical system of a holographic memory system according to the present invention.

Then FIG. 6 shows such a holographic memory system which will be outlined below.

In FIG. 6, an encoder 25 converts digital data to be recorded in a holographic memory 1 to a light/dark dot pattern image on a plane, and rearranges the dot pattern image into a data array of, for example, 480 bits in the vertical direction and 640 bits in the horizontal direction (480×640) to generate sequence data in unit pages. This data is sent to a spatial light modulator (SLM) 12, such as a transmission-type TFT liquid crystal display (LCD) panel, by way of example.

The spatial light modulator 12, which has a modulation processing unit corresponding to the unit page composed of 480 bits in the vertical direction and 640 bits in the horizontal direction (480×640), optically modulates a light beam irradiated thereto to spatial light on/off signal in accordance with the unit page sequence data from the encoder 25, and leads the modulated signal beam or signal light to a lens 13. More specifically, the spatial light modulator 12 passes therethrough a signal beam corresponding to a logical value "1" in the unit page sequence data which is an electrical signal, and blocks the signal beam corresponding to a logical value "0" in the unit page sequence data to achieve photoelectric conversion in accordance with respective bit contents of the unit page data, thereby generating a signal beam which is modulated as signal light of the unit page sequence.

The signal light is incident on the holographic memory 1 through a lens 13. In addition to the signal light, the holographic memory 1 is also irradiated with reference light at an incident angle β from a predetermined base line orthogonal to the optical axis of the beam of the signal light.

The signal light and the reference light interfere with each other in the holographic memory 1 to produce interference fringes which are stored in the holographic memory 1 as a refractive index grating or hologram to record the data. Also, the holographic memory 1 provides for three-dimensional data recording by entering the reference light thereto with a different incident angle β to record a plurality of two-dimensional planar data in an angle multiplex scheme.

For reproducing recorded data from the holographic memory 1, the reference light only is directed into the holographic memory 1 at the same incident angle β as upon recording toward the center of a region in which the signal light beam and the reference light beam intersect. In other words, unlike recording, the signal light is not directed. In this way, diffraction light from the interference fringes recorded in the holographic memory 1 is transmitted to a CCD (Charge Coupled Device) 22, which functions as a photodetector, through a lens 21. The CCD 22 converts light and dark of the incident light to the intensity of an electrical signal to produce an analog electrical signal having a level in accordance with the luminance of the incident light, which is output to a decoder 26. The decoder 26 compares this analog signal with a predetermined amplitude value (slice level) to reproduce corresponding data "1" and "0".

Since the holographic memory records data in two-dimensional planar data sequences as described above, the angle multiplex recording can be accomplished by changing the incident angle β of the reference light. Stated another way, a plurality of two-dimensional planes as recording units can be defined in the holographic memory by changing the incident angle β of the reference light, with the result that the three-dimensional recording is enabled.

As apparent from FIG. 7, the diffraction efficiency of several percent is obtained in five seconds from even an unreduced, Tb-doped $LiNbO_3$ single crystal and it is equivalent to the sensitivity of a hologram which is written in a single color using the conventional material of Fe-doped $LiNbO_3$.

Further, the diffraction efficiency was maintained over a long period of time in reproduction.

Figure 1:
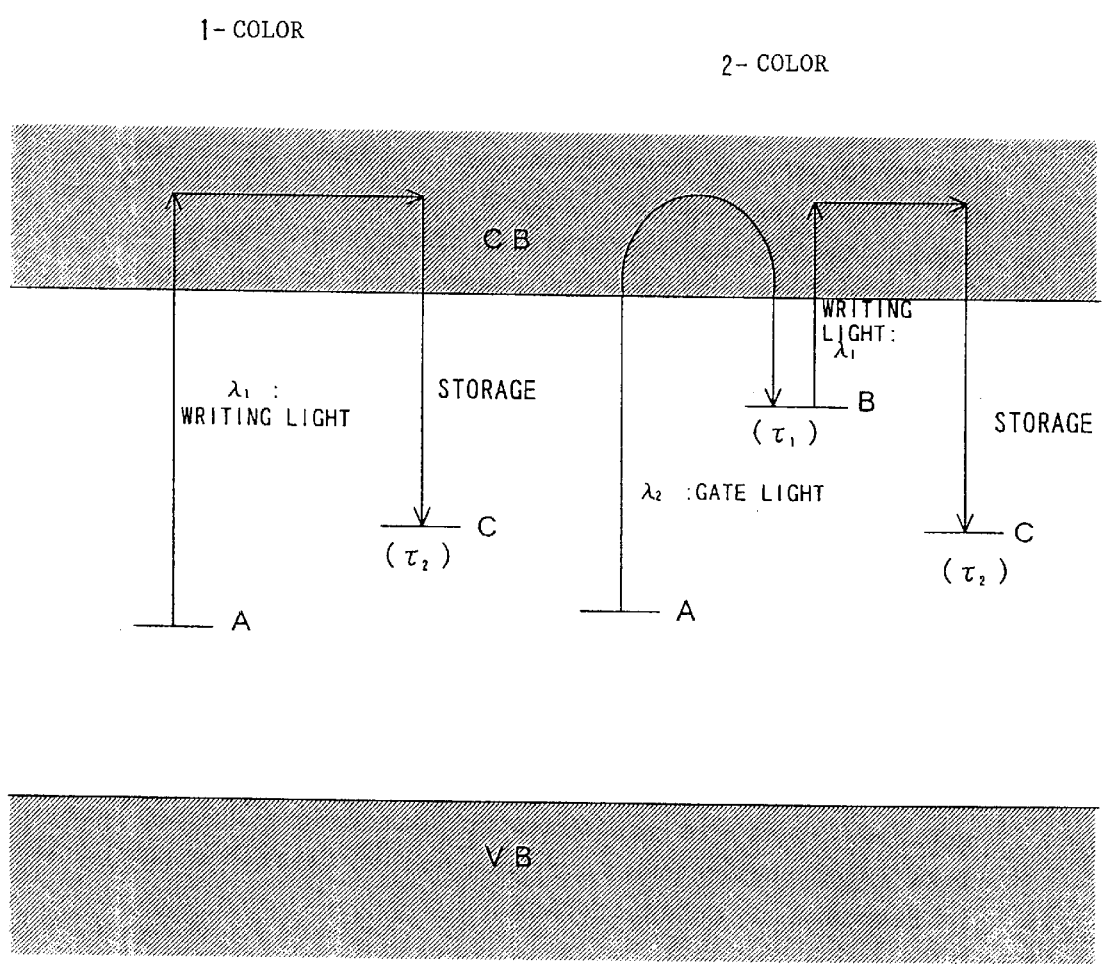
FIG. 1 is a diagram showing an electron excitation model using a single color hologram recording and two-color hologram recording.
Figure 2:
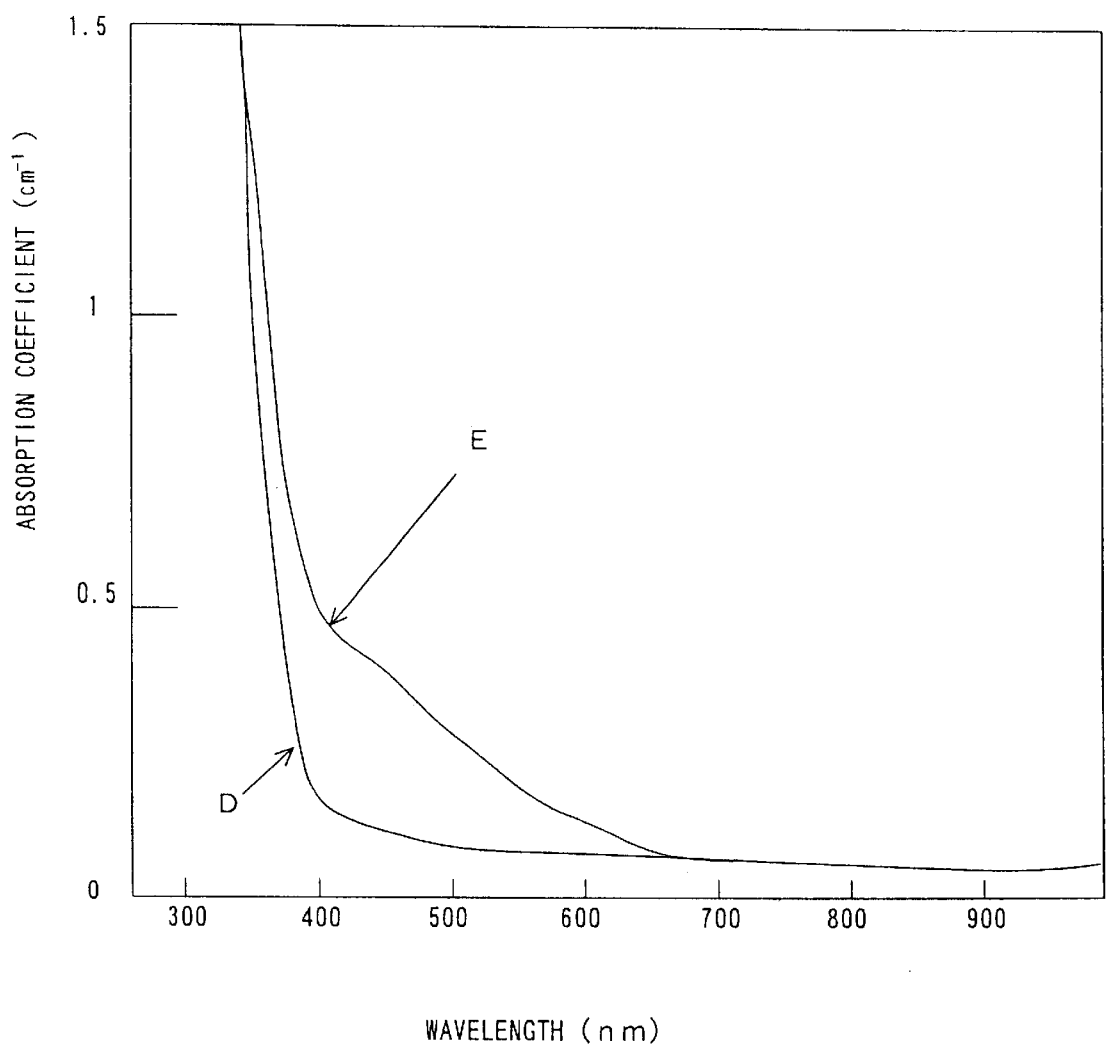
FIG. 2 is a graph showing changes in light absorption spectrums of an as-grown photorefractive material according to the present invention which comprises a $LiTaO_3$ single crystal doped with terbium (Tb) and of the same crystal caused after irradiation of 313-nm ultraviolet rays thereonto.
Figure 8:
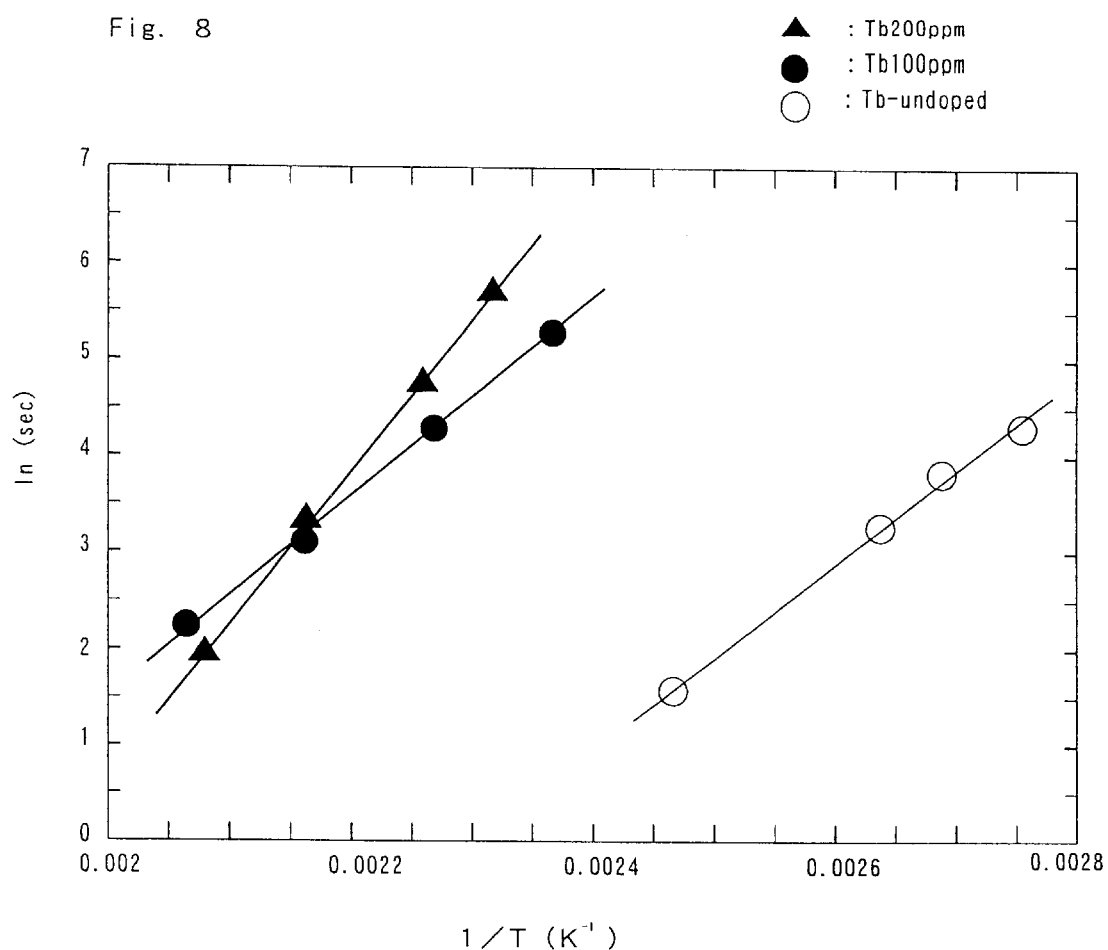
FIG. 8 is a graph showing a storage time for a hologram in a Tb-doped $LiNbO_3$ single crystal according to the present invention at room temperature, and data of a conventional hologram.

The storage time at room temperature was computed from the time constant of thermal excitation from the trap "C" at the deep level shown in FIG. 1. As shown in FIG. 8, the storage time is two months when 100 weight ppm of Tb is doped, 69 years when 200 weight ppm of Tb is doped, and 300 years, which is a considerable long recording time, when Fe is doped at the same time. This material is much superior as a memory material to the conventional material of Fe-doped $LiNbO_3$.

Figure 9:
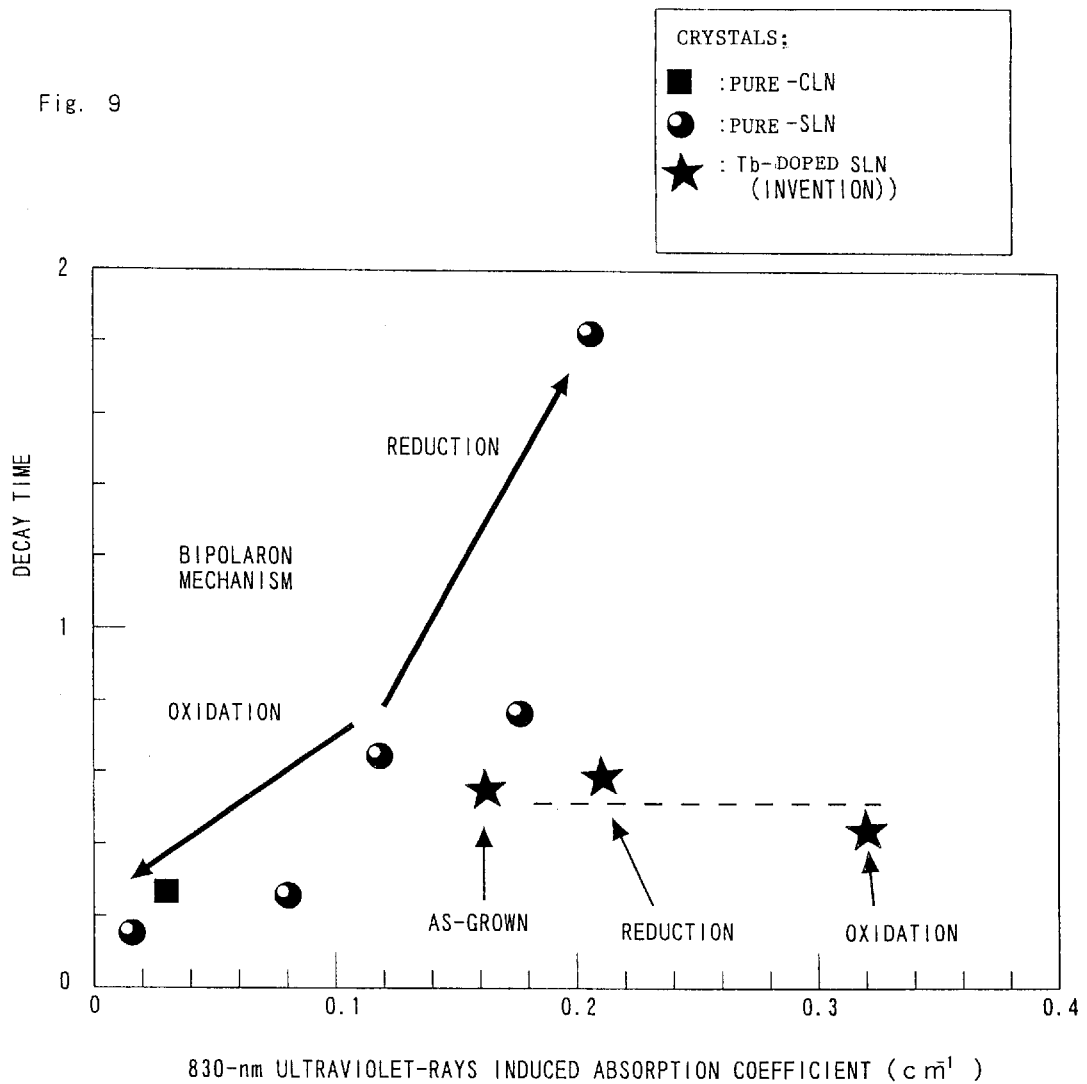
FIG. 9 is a graph showing a relationship between the absorption coefficient and the decay time of a Tb-doped. $LiNbO_3$ single crystal according to the present invention in which the absorption is induced by the 830-nm near infrared-rays, and data of conventional crystals.

Further, the relationship between the absorption coefficient of 830-nm near infrared-rays excited absorption and the decay time was measured for the conventional method using a bipolaron mechanism and the Tb-doped $LiNbO_3$ single crystal according to the present invention. The results are given in FIG. 9. As apparent from this figure, the Tb-doped $LiNbO_3$ single crystal of the present invention does not show a significant change in characteristic by oxidation and reduction as compared with the conventional $LiNbO_3$ single crystal that contains no additive, and has the adequate decay time and a high absorption coefficient.

EXAMPLE 2

$LiNbO_3$ Single Crystal Having a Constant-ratio Composition Doped With Both Tb and Fe Using a method similar to that for Example 1, (1) a $LiNbO_3$ single crystal doped with 100 weight ppm of Tb, (2) a $LiNbO_3$ single crystal doped with 200 weight ppm of Tb, (3) a $LiNbO_3$ single crystal doped with 200 weight ppm of Tb and also with 100 weight ppm of Fe, and (4) a $LiNbO_3$ single crystal doped with 200 weight ppm of Tb and also with 5 weight ppm of Fe were grown, and the storage time at room temperature was computed from the time constant of thermal excitation from the trap "C" at the deep level shown in FIG. 1. The results are given in Table 1 below.

TABLE 1

| Doping amount of Tb + doping amount of Fe in $LiNbO_3$ | Decay time τ1 of trap B | Decay time τ2 of trap C |
|---|---|---|
| Tb 100 ppm | ~4 seconds | ~2 months |
| Tb 200 ppm | ~4 seconds | ~69 years |
| Tb 200 ppm + Fe 5 ppm | ~100 ms | ~100 years |
| Tb 200 ppm + Fe 100 ppm | <1 ms | >300 years |

As apparent from Table 1, it is possible to control the life of the carriers in the intermediate excitation state by doping Tb and control the life of the storage center by doping Tb and Fe.

(1) Unlike the conventional bipolaron mechanism, two-color hologram recording according to the present invention does not require reduction. This prevents the excessive reduction originated increase in dark conductivity, so that the storage time (data preserving time) will not become shorter.

(2) It is possible to control the lifetime (τ1) of the intermediate excitation state.

In addition to the embodiments of Tb-doped lithium niobate ($LiNbO_3$) as the foregoing description, single crystals of Tb-doped lithium tantalate ($LiTaO_3$) showed similar effects to the Tb-doped lithium niobate. It is also preferable that the single crystal of lithium tantalate ($LiTaO_3$) should have the molar fraction of $[Li_2O]/([Li_2O]+[Ta_2O_5])$ that lies in a range of 0.482 to 0.505 preferably 0.490 to 0.505 or 0.495 to 0.500.

As the photorefractive material according to the present invention comprises a single crystal of niobate or tantalate doped with terbium (Tb), it provides an oxide ferroelectric single crystal as a recording material for a holographic memory which has the following advantages (1) to (4), more specifically, lithium niobate single crystal or lithium tantalate single crystal which is suitable for recording a two-color hologram.

(1) The absorption center A, the intermediate excitation level "B" (shallow trap level) and the storage center "C" (deep trap level) shown in FIG. 1 which are needed to record a two-color hologram are formed efficiently.

(2) An as-grown crystal can be used. That is, a crystal without undergoing reduction and oxidation can be used.

(3) There are no reduction- or oxidation-originated significant change in the characteristic.

(4) The absorption coefficient at the absorption center "A" can be controlled by adjusting the doping amount of Tb, and the time constant of thermal release from the trap at the intermediate excitation level "B" can be controlled by doping Fe, Mn, Cr or Ni in addition to Tb. That is, it is possible to change the lifetime of the carriers at the intermediate excitation level in accordance with the doping amount of Fe (or Mn, Cr or Ni).

Those features of the present invention can dramatically improve the characteristics of a photorefractive material as a two-color holographic recording medium. Further, the photorefractive material of the present invention can be adapted to optical functional devices, such as a phase conjugating mirror, a coherent light amplifier based on beam fining or optical mixing and a filter.

What is claimed is:

1. A process of recording data on a two-color holographic recording medium comprising the steps of:

irradiating the recording medium with gate light having a first wavelength; and irradiating the recording medium with reference and signal light having a second wavelength to record a hologram;

wherein the recording medium comprises a single crystal of terbium-doped lithium niobate, wherein said crystal exhibits a stoichiometric composition, wherein said crystal has not undergone reduction, wherein said lithium niobate crystal has a molar fraction of $[Li_2O]/([Li_2O]+[Nb_2O_5])$, and wherein said molar fraction ranges from about 0.490 to about 0.505.

2. A process of recording data on a two-color holographic recording medium comprising the steps of:

irradiating the recording medium with gate light having a first wavelength; and irradiating the recording medium with reference and signal light having a second wavelength to record a hologram, wherein the recording medium comprises a single crystal of terbium-doped lithium tantalate, wherein said crystal exhibits a stoichiometric composition, wherein said crystal has not undergone reduction, wherein said lithium tantalate crystal has a molar fraction of $[Li_2O]/([Li_2O]+[Ta_2O_5])$, and wherein said molar fraction ranges from about 0.490 to about 0.505.

3. The process of claim 1 or 2, wherein the amount of terbium in the terbium-doped crystal ranges from about 10 to about 1000 ppm.

4. The process of claim 1 or 2, wherein said terbium-doped crystal further contains at least one element selected from the group consisting of Fe, Mn, Cr and Ni.

5. The process of claim 4, wherein said additional element is present in an amount ranging from about 1 to about 500 ppm.

6. The process of claim 5, wherein said additional element is Fe, present in an amount ranging from about 1 to about 100 ppm.

7. The process of claim 6, wherein said Fe is present in an amount ranging from about 1 to about 5 ppm.

8. The process of claim 1 or 2, wherein said two-color holographic recording medium is formed into a predetermined shape selected from the group consisting of cube, cylinder, sphere, disk, rectangular parallelepiped, and polyhedron.

* * * * *